(12) United States Patent
Ryu

(10) Patent No.: US 8,835,280 B1
(45) Date of Patent: Sep. 16, 2014

(54) SEMICONDUCTOR DEVICE AND METHOD FOR MANUFACTURING THE SAME

(71) Applicant: SK hynix Inc., Icheon-si (KR)

(72) Inventor: Seong Wan Ryu, Yongin-si (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/046,531

(22) Filed: Oct. 4, 2013

(30) Foreign Application Priority Data

May 22, 2013 (KR) .................. 10-2013-0057880

(51) Int. Cl.
*H01L 21/28* (2006.01)
*H01L 29/51* (2006.01)

(52) U.S. Cl.
CPC .......... *H01L 21/28008* (2013.01); *H01L 29/51* (2013.01)
USPC ........... 438/437; 438/257; 438/294; 257/288; 257/330

(58) Field of Classification Search
CPC .................................................. H01L 29/7813
USPC ........................ 438/437, 257, 294; 257/330
See application file for complete search history.

(56) References Cited

U.S. PATENT DOCUMENTS 5,766,971 A * 6/1998 Ahlgren et al. ............... 438/296
2006/0145287 A1* 7/2006 Kim .............................. 257/510

FOREIGN PATENT DOCUMENTS

| KR | 10-2007-0063821 A | 6/2007 |
| KR | 10-2009-0044562 A | 5/2009 |

* cited by examiner

*Primary Examiner* — Marc Armand

(57) ABSTRACT

A method for manufacturing a semiconductor device includes forming a device isolation film defining an active region, forming a recess configured to expose a seam contained in the device isolation film by etching the active region and the device isolation film, forming a sacrificial film to fill the exposed seam, and forming a gate at a lower part of the recess.

12 Claims, 8 Drawing Sheets

SEMICONDUCTOR DEVICE AND METHOD FOR MANUFACTURING THE SAME

CROSS-REFERENCE TO RELATED APPLICATION

The priority of Korean patent application No. 10-2013-0057880 filed on 22 May 2013, the disclosure of which is hereby incorporated by reference in its entirety, is claimed.

BACKGROUND

Embodiments relate to a semiconductor device and a method for manufacturing the same, and more particularly to a semiconductor device in which a seam formed in a device isolation film defining an active region is filled with a sacrificial film, and a method for manufacturing the same.

With an increasing integration degree of a semiconductor device, a pattern, including a device isolation region, formed over a cell region of a semiconductor substrate has been reduced to prevent the occurrence of electric connection between patterns.

A conventional device isolation region has been formed through a local oxidation of silicon (LOCOS) process. As the device isolation region has been gradually reduced in size, a shallow trench isolation (STI) process capable of forming a superior small-sized device isolation region has been developed as an alternative to the LOCOS process.

In accordance with the STI process, after a trench having a predetermined depth is formed in a semiconductor substrate, an insulation material is deposited to fill the trench, and an unnecessary insulation film is removed through a subsequent CMP process, such that a device isolation region for electrically isolating active regions is formed.

However, as a design rule is gradually reduced, an aspect ratio of a trench is gradually increased, such that a method for forming a device isolation film using the STI process is confronted with the limitation in trench filling.

For example, a void or seam may occur in an insulation film when the insulation film is filled in the trench, such that reliability and productivity of a highly-integrated semiconductor device are reduced. If the seam occurs in a device isolation film, a word-line material may extend into the seam when the word line (gate) is formed in a subsequent process, resulting in a bridge between several word lines.

Moreover, when the device isolation film is formed of an oxide film so as to minimize the loss of a silicon substrate as well as to maximize a thickness of a wall oxide film, seams (or voids) may occur in the device isolation film.

SUMMARY

Various embodiments are directed to providing a semiconductor device and a method for manufacturing the same to address issues of the related art.

An embodiment relates to a method for forming a device isolation film of the semiconductor device so as to prevent device characteristics from being deteriorated by a void and seam created when a trench of a device isolation region is filled in the STI process.

In accordance with an aspect of the embodiment, a method for manufacturing a semiconductor device includes: forming a device isolation film defining an active region; forming a recess configured to expose a seam contained in the device isolation film by etching the active region and the device isolation film; forming a sacrificial film to fill the exposed seam; and forming a gate in a lower part of the recess.

In accordance with another aspect of the embodiment, a semiconductor device includes: a device isolation film to define an active region; a gate recess exposing the active region and the device isolation film to define a gate region; and a gate formed in the gate recess, wherein the device isolation film includes a first insulation film and a sacrificial film filling a seam in the first insulation film.

It is to be understood that both the foregoing general description and the following detailed description of embodiments are exemplary and explanatory.

DESCRIPTION OF EMBODIMENTS

Reference will now be made in detail to certain embodiments, examples which are illustrated in the accompanying drawings. Wherever possible, the same reference numbers will be used throughout the drawings to refer to the same or like parts. In the following description, a detailed description of well-known configurations or functions may be omitted.

Figure 1:
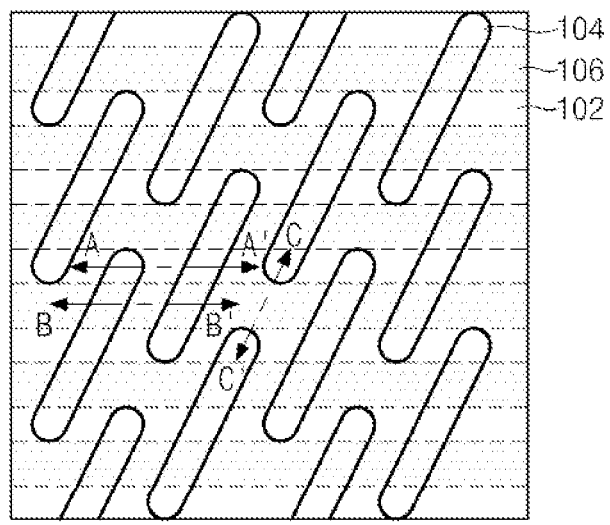
FIG. 1 is a plan view illustrating a layout of a semiconductor device according to an embodiment.
Figure 2:
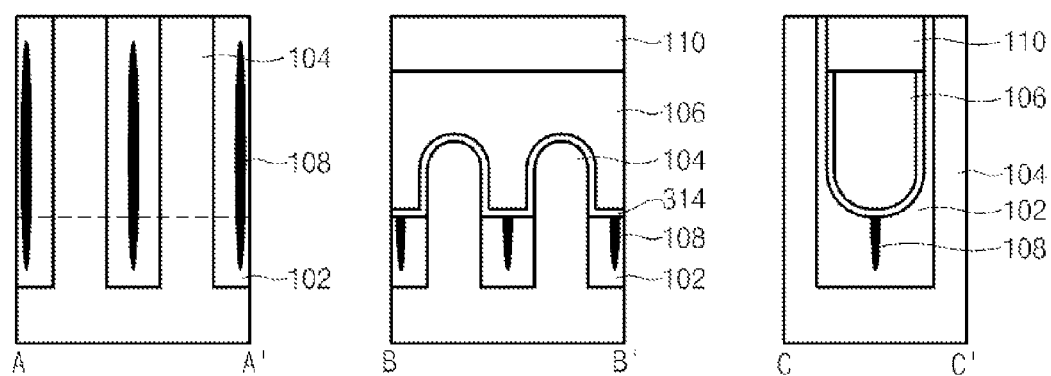
FIG. 2 is a cross-sectional view illustrating the semiconductor device taken along the lines A-A', B-B', and C-C' of FIG. 1.

FIG. 1 is a plan view illustrating a layout of a semiconductor device according to an embodiment. FIG. 2 is a cross-sectional view illustrating the semiconductor device taken along the lines A-A', B-B', and C-C' of FIG. 1.

The semiconductor device according to the embodiment may be configured to have a $6F^2$ structure in which an active region 104 defined by a device isolation film 102 is not perpendicular to a gate (word line) 106 and is tilted at a predetermined angle other than a right angle with respect to the gate (word line) 106. In this case, the gate 106 may have a buried gate structure buried below the active region 104. The device isolation film 102 and the active region 104 of the gate region may be formed in a fin structure in such a manner that the active region 104 is more protruded than the device isolation film 102 when viewed from the cross-section B-B'. That is, the buried gate 106 may be in contact with a top surface and sidewalls of the protruded portion of the active region 103, such that the buried gate 106 may be formed in a fin gate structure and channels are formed over the three-dimensional active region 103.

The device isolation film 102 according to the embodiment may include a sacrificial film 108. In this case, the sacrificial film 108 is formed in a portion where a conventional seam (or void) may arise (referred to as 'conventional seam formation region'). That is, according to this embodiment, the sacrificial film 108 is filled in the conventional seam formation region, such that the seam formed in the device isolation film 102 is removed (or eliminated).

In accordance with a method for filling the seam with the sacrificial film 108, a recess (not shown) for forming the buried gate 106 is formed and an insulation material is buried (gapfilled) in the recess. Since it is difficult to completely gapfill the insulation film for device isolation during the formation of the device isolation film 102, the device isolation film 102 is formed while having seams (or voids) inside. Thereafter, when the active region 104 and the device isolation film 102 are etched to form a recess for a buried gate, the seam is exposed. The exposed seam is gapfilled with an insulation film 108, such that the sacrificial film 108 is formed in the device isolation film 102. A method for forming the sacrificial film 108 will hereinafter be described in detail. The sacrificial film 108 may be a silicon layer.

Since voids (or seams) which may be created in the trench for device isolation can be filled and removed by a sacrificial film formed in the subsequent process, the trench for device isolation can be formed as deep as possible without a concern about the voids (or seams). Thus, an electric field barrier can be formed at such a level as to prevent retention time deterioration.

In addition, the trench for device isolation may be filled with the oxide film, preferably, only a high temperature oxide (HTO) film. When the device isolation trench is gap-filled with the oxide film, the oxide film may be formed through deposition to a maximum thickness allowed by a given reduced design rule. When the device isolation trench is formed through deposition, a width of the protruding portion (channel region or a fin gate region) can be maintained intact. In other words, the active region under the buried gate 106 protrudes higher than the device isolation region under the buried gate 106. See FIG. 2, B-B cross-sectional view.

Accordingly, a loss of a silicon layer (active region) forming the channel region is minimized and a fin gate region can be maintained with a relatively larger width in a subsequent process. Thus, the width of the active region under the buried gate 106 (or fin gate region or the channel region) can be maintained substantially as same as a width of the protruded portion of the active region shown in the cross-section B-B' of FIG. 2.

A sealing insulation film 110 for insulating the buried gate 106 is formed over the buried gate 106. The sealing insulation film may include a nitride film. The sealing insulation film 110 is not shown in FIG. 1 for convenience of description.

FIGS. 3 to 7 are cross-sectional views illustrating a method for forming the semiconductor device shown in FIG. 2.

Figure 3:
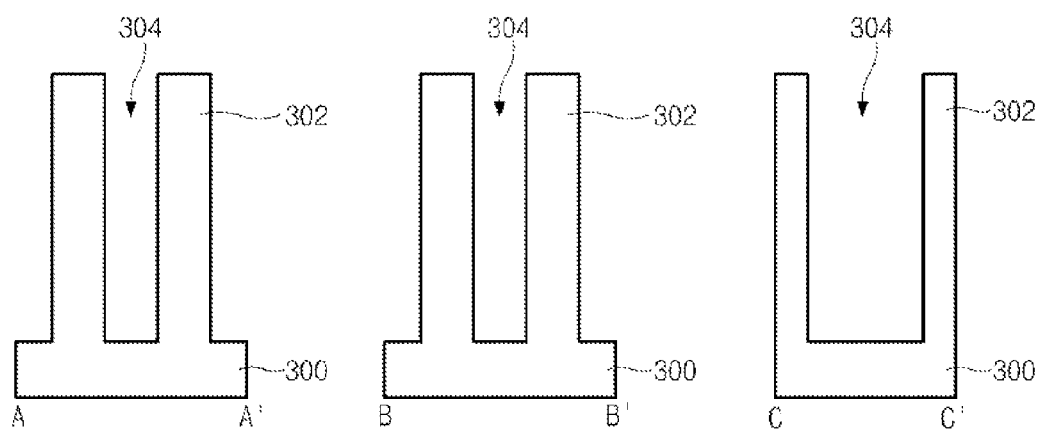
FIGS. 3 to 7 are cross-sectional views illustrating a method for forming the semiconductor device shown in FIG. 2.

Referring to FIG. 3, a pad oxide film (not shown) and a pad nitride film (not shown) are formed over a semiconductor substrate 300, and a photoresist film (not shown) is formed over the pad nitride film. In this case, the pad oxide film is formed to prevent stress caused by the pad nitride film from being applied to the semiconductor substrate 300. Subsequently, an exposure and development process is performed on the photoresist film, such that a photoresist pattern (not shown) is formed to define an active region 302.

The pad nitride film and the pad oxide film are etched using the photoresist pattern as a mask, resulting in formation of a mask pattern. The semiconductor substrate 300 is etched using the hard mask pattern as a mask, such that a device isolation trench 304 is formed to define the active region 302.

Figure 4:
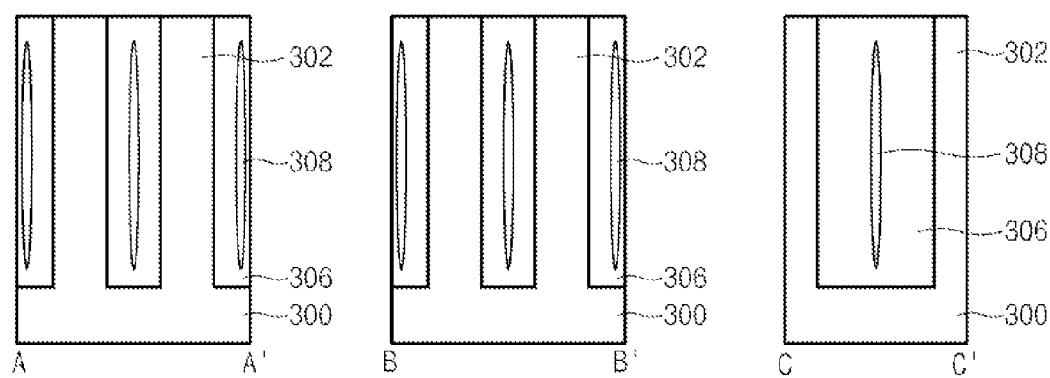

Referring to FIG. 4, the device isolation trench 304 is filled with a device isolation insulation material, resulting in formation of the device isolation film 306. In this case, the device isolation insulation film may include an oxide film, and the oxide film may include a HTO film having superior step coverage. That is, the oxide film (HTO film) is deposited over an exposed surface of the device isolation trench 304 in such a manner that the device isolation trench 304 is filled with the HOT oxide film.

Specifically, when the device isolation film 306 is formed, the formation process of the HTO film and the dry oxidation process are alternately performed. For example, after the HTO film is formed over the exposed surface of the device isolation trench 304, the dry oxidation process is performed on the HTO film, and the HTO film is further formed over the dry oxidation resultant film, as denoted by (HTO+Dry+ HTO). If necessary, each of the HTO oxidation process and the dry oxidation process may be performed once. After the formation of the HTO film, an annealing process may be performed on the HTO film such that a quality of the oxide film can be enhanced.

After the formation of the device isolation film 306, the pad nitride film and the pad oxide film are removed. For example, the pad nitride film is removed by a dry etching process using a phosphoric solution, and the pad oxide film is then removed by a wet etching process using a hydrogen fluoride solution.

As described above, when the device isolation film is formed of the oxide film, the same effect is obtained as in the case in which the wall oxide film) of a thick thickness is formed, resulting in improvement of device characteristics. However, if the device isolation film is formed of the oxide film only, specifically, if the device isolation film is formed of the HTO film only, a seam 308 occurs in the device isolation film. A method for removing the seam 308 according to the embodiment will hereinafter be described.

Figure 5:
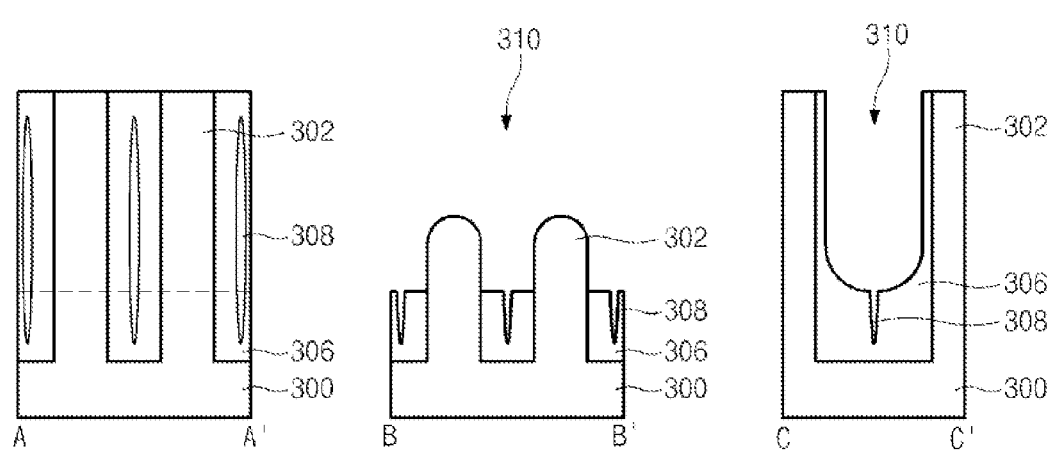

Referring to FIG. 5, a mask pattern (not shown) defining the buried gate region is formed over the active region 302 and the device isolation film 306 including the seam. Here, the buried gate region may correspond to a specific region in which the buried gate 106 of FIG. 1 is formed.

Subsequently, the active region 302 and the device isolation film 306 are etched using the mask pattern as an etch mask, such that a recess 310 for a gate is formed such that the buried gate can be formed in the recess 310. In this case, the device isolation film 306 is more deeply etched than the active region 302 according to an etch selection ratio between the active region 302 and the device isolation film 306, resulting in formation of a fin structure. That is, a bottom of the active region 302 exposed in the gate recess 310 is more protruded than a bottom of the device isolation film 306 exposed in the gate recess 310.

As a result, seams 308 formed in the device isolation film 306 are exposed by the gate recess 310 according to the embodiment. That is, because of the gate recess 310, the seams 308 are exposed at the bottom and sidewalls of the gate recess 310.

Figure 6:
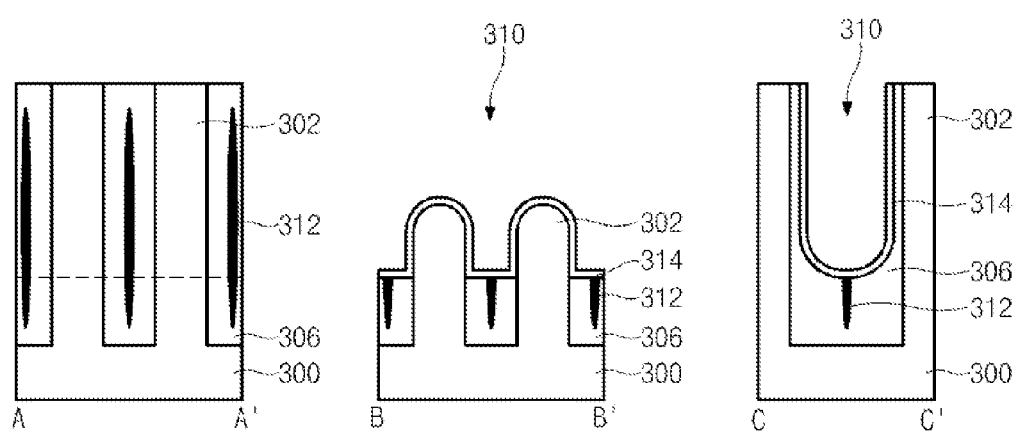
Figure 8:
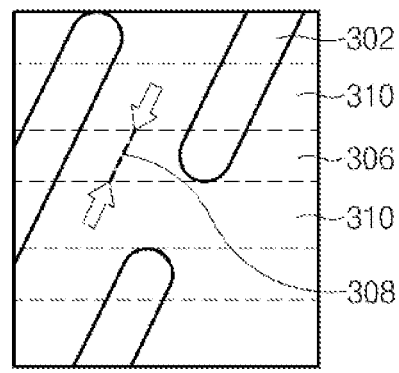
FIG. 8 illustrates a sacrificial film of FIG. 6 which is introduced into both sides of a seam.

Referring to FIG. 6, a sacrificial film 312 is formed over the inner surface of the gate recess 310 in such a manner that the exposed seam 308 can be filled with the sacrificial film 312. When forming the sacrificial film 312, most of the seam 308 (See the B-B' cross-sectional view and the C-C' cross-sectional view of FIG. 5) exposed at the bottom of the gate recess 310 have low aspect ratios and thus the sacrificial film 312 can be easily filled into the seam 308. In addition, although the seams 308 (See the A-A' cross-sectional view of FIG. 5) exposed at the sidewalls of the gate recess 310 tend to have high aspect ratios, the sacrificial film 312 can fill the seams 308 by being introduced from sides of the seam 308 to the inside of the seams 308 through the gate recess 310 as shown in arrows of FIG. 8, instead of being introduced from an upper portion of the seams 308. Accordingly, the sacrificial film 312 can be easily introduced into the inside of the seam 308 which are exposed at the sidewalls of the gate recess 310. In FIG. 8, only one seam among several seams formed in the device isolation film 306 between the gate recesses 310 is denoted by a dotted line for convenience of description. In addition, each arrow marked at both sides of the seam 308 of FIG. 8 indicates the direction along which the sacrificial film 312 is introduced into the seam 308. The sacrificial film 312 may be replaced with silicon (Si). When the sacrificial film 312 includes silicon (Si), the silicon (Si) will be oxidized in a subsequent process. Alternatively, the sacrificial film 312 may include a nitride film. For example, Atomic Layer Deposition (ALD) or Chemical Vapor Deposition (CVD) may be used to fill the seam 308 with the sacrificial film 312.

If the seam 308 is buried (gapfilled) with the sacrificial film 312, the sacrificial film 312 formed over the active region 302 and the device isolation film 306 is oxidized, such that a gate insulation film 314 for capping the sacrificial film 312 is formed over the inner surface of the gate recess 310. Alternatively, after the sacrificial film 312 remaining over the active region 302 and the device isolation film 306 is removed, the gate insulation film 314 may be formed over the active region 302 and the device isolation film 306 exposed in the gate recess 310, such that the sacrificial film 312 is covered with the gate insulation film 314. The gate insulation film 314 may be formed by oxidizing the sacrificial film 312 located in the active region 302 and the device isolation film 306 through radical oxidation. In another example, a high dielectric material having a high permittivity is deposited over the active region 302 and the device isolation film 306 in the gate recess 310 using Atomic Layer Deposition (ALD) or Chemical Vapor Deposition (CVD), such that the gate insulation film 314 can be formed.

Figure 7:
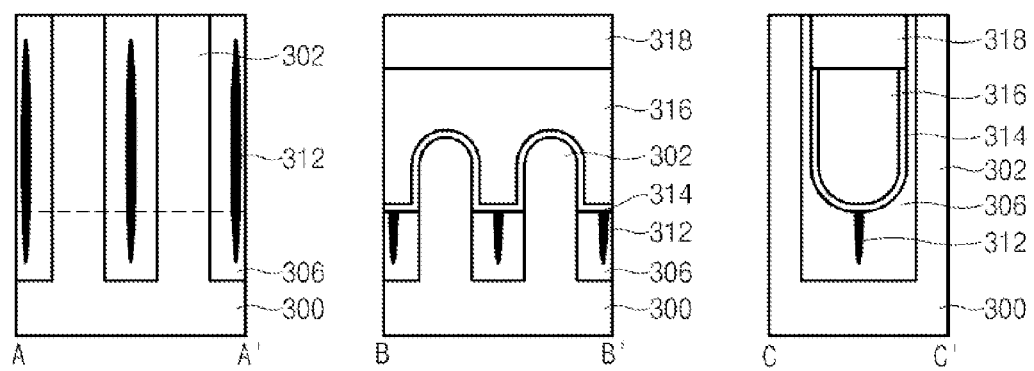

Referring to FIG. 7, after the gate recess 310 is filled with a conductive film for the gate, the gate conductive film is planarized or subject to a CMP process. In this case, the gate conductive film may be a single metal material such as titanium (Ti), titanium nitride (TiN), tungsten (W) or tungsten nitride (WN), or a combination thereof. Alternatively, other conductive material such as a doped polysilicon material may be used as the gate conductive film.

Thereafter, the gate conductive film is selectively removed in such a manner that the gate conductive film of a predetermined thickness remains at a lower part of the gate recess 310, resulting in formation of a buried gate 316. In this case, an upper part of the gate conductive film may be selectively removed through an etch-back process.

Subsequently, a sealing insulation film 318 is formed over the buried gate 316 in such a manner that the gate recess 310 is filled with the sealing insulation film 318. The sealing insulation film 318 may include a silicon nitride ($Si_3N_4$) film. Chemical vapor deposition (CVD) may be used as a method for forming the sealing insulation film 318. In this case, the CVD may include Atmospheric Pressure CVD (APCVD), Low Pressure CVD (LPCVD), Plasma Enhanced CVD (PECVD), Metal Organic CVD (MOCVD), and thermal CVD.

The subsequent fabrication processes may be performed in a similar manner as those for a semiconductor device including a typical buried gate structure, and as such a detailed description thereof will herein be omitted for convenience of description.

As is apparent from the above description, since the device isolation film is formed of an oxide material and a thicker wall oxide film is guaranteed, various operation characteristics of the semiconductor device can be enhanced. For example, reliability of a data retention time (tREF) increases, a wordline dist (WL-Dist) characteristic is improved, channel resistance is reduced, and a hot electron induced punch-through (HEIP) phenomenon is prevented from occurring in a transistor of the peripheral region.

In accordance with the embodiments, when the device isolation film is formed of an oxide film, a seam possibly existing in the device isolation film can be easily removed, and gapfill characteristics of the device isolation film can be improved.

In addition, the number of fabrication processes of the semiconductor device can be simplified or reduced when the device isolation film is formed by the above fabrication method shown in the embodiments.

Those skilled in the art will appreciate that the present embodiments may be carried out in other ways other than those set forth herein without departing from the spirit and essential characteristics of the present embodiments. The above exemplary embodiments are therefore to be construed in all aspects as illustrative and not restrictive.

The above embodiments are illustrative and not limitative. Various alternatives are possible. The embodiments are not limited by the type of deposition, etching polishing, and patterning steps described herein. Nor are the embodiments limited to any specific type of semiconductor device. For example, the present embodiments may be implemented in dynamic random access memory (DRAM) devices or non-volatile memory devices. Other additions, subtractions, or modifications can be made.

What is claimed is:

1. A method for manufacturing a semiconductor device comprising:
   forming a device isolation film defining an active region;
   forming a recess configured to expose a seam contained in the device isolation film by etching the active region and the device isolation film;
   forming a sacrificial film to fill the exposed seam; and
   forming a gate in a lower part of the recess.

2. The method according to claim 1, the method further comprising:
   forming a gate insulation film over an inner surface of the recess such that the sacrificial film is covered with the gate insulation film.

3. The method according to claim 2, wherein the forming the gate insulation film includes:
   after the formation of the sacrificial film, oxidizing the sacrificial film.

4. The method according to claim 2, wherein the forming the gate insulation film includes:
   after the formation of the sacrificial film, removing the sacrificial film; and
   depositing an oxide film over a region from which the sacrificial film is removed.

5. The method according to claim 1, wherein the forming the sacrificial film includes:
   filling the seam with a silicon material.

6. The method according to claim 1, wherein the forming the device isolation film includes:
   forming a trench defining the active region; and
   filling the trench by depositing an oxide film.

7. The method according to claim 6, wherein the filling the trench includes:
   filling a first high temperature oxide (HTO) film in the trench; and
   performing dry oxidation on the first HTO film.

8. The method according to claim 7, the method further comprising:
   forming a second HTO film over the dry-oxidized first HTO film.

9. The method according to claim 7, the method further comprising:
   annealing the first HTO film.

10. The method according to claim 1, wherein the forming the recess includes:
    forming a fin structure in which the active region under the gate is protruded higher than the device isolation film under the gate.

11. The method according to claim 1, wherein the forming the sacrificial film includes:

applying the sacrificial film from a sidewall of the seam exposed by the recess to the inside of the seam through the recess.

12. The method according to claim 1, the method further comprising:

forming a sealing insulation film over the gate so as to fill the recess.

* * * * *